(12) United States Patent
Superfine et al.

(10) Patent No.: US 12,745,593 B2
(45) Date of Patent: Sep. 22, 2026

(54) DETECTION OF A POSITION OF A WAFER WITHIN A TRANSFER ROBOT VACUUM CHAMBER

(71) Applicant: Tower Semiconductor Ltd., Migdal Haemek (IL)

(72) Inventors: Slava Superfine, Migdal Haemek (IL); Yaniv Malachy, Migdal Haemek (IL); Dany Trabelsi, Migdal Haemek (IL)

(73) Assignee: Tower Semiconductor Ltd., Migdal Haemek (IL)

(*) Notice: Subject to any disclaimer, the term of this patent is extended or adjusted under 35 U.S.C. 154(b) by 946 days.

(21) Appl. No.: 17/821,175

(22) Filed: Aug. 21, 2022

(65) Prior Publication Data

US 2024/0063038 A1 Feb. 22, 2024

(51) Int. Cl.
*H10P 72/00* (2026.01)
*G01B 11/27* (2006.01)

(52) U.S. Cl.
CPC ........ *H10P 72/0606* (2026.01); *G01B 11/272* (2013.01)

(58) Field of Classification Search
CPC .................... H01L 21/67265; H01L 21/67259
See application file for complete search history.

(56) References Cited

U.S. PATENT DOCUMENTS 5,796,486 A * 8/1998 Jacob ................ H01L 21/67259 250/548
6,621,092 B1 * 9/2003 Furuta ............... H01L 21/67265 250/559.4
7,217,076 B2 5/2007 Bonora
10,684,563 B2 6/2020 Manassen
11,626,305 B2 4/2023 Koprc
2004/0144933 A1 * 7/2004 Emoto .............. H01L 21/67265 250/559.4
2005/0004697 A1 * 1/2005 Krupyshev ....... H01L 21/67265 700/114
2005/0086024 A1 * 4/2005 Seeberger, Jr. ... H01L 21/67265 702/150
2005/0242305 A1 * 11/2005 Oka .................. H01L 21/67265 250/559.29
2008/0290881 A1 * 11/2008 Mallory ............ H01L 21/67265 324/690
2012/0281875 A1 * 11/2012 Yasuda ............. H01L 21/67265 382/103
2017/0287763 A1 * 10/2017 Ammerl ............ H01L 21/67766
2023/0036587 A1 * 2/2023 Wang ................... G01B 11/275
2023/0063662 A1 * 3/2023 Aida ........................ H01L 21/68
2023/0064941 A1 * 3/2023 Lee ..................... H01L 21/6833

* cited by examiner

*Primary Examiner* — Shawn Decenzo
(74) *Attorney, Agent, or Firm* — Reches Patents

(57) ABSTRACT

A location detection system for detecting a location of a wafer within a transfer robot vacuum chamber (TRVC), the detection system may include (i) an illumination unit that is configured to direct a transmitted radiation pattern through a transparent window of the TRVC and towards one or more TRVS reflecting elements located below an upper side of a wafer holding element of the transfer robot; wherein the illumination unit is located outside the TRVC; (ii) a sensing unit that is configured to generate one or more detection signals indicative of a received radiation pattern that is reflected from the one or more TRVS reflecting elements; and (iii) a location processing circuit that is configured to detect a location of the wafer based on the one or more detection signals.

20 Claims, 3 Drawing Sheets

Figure 3:
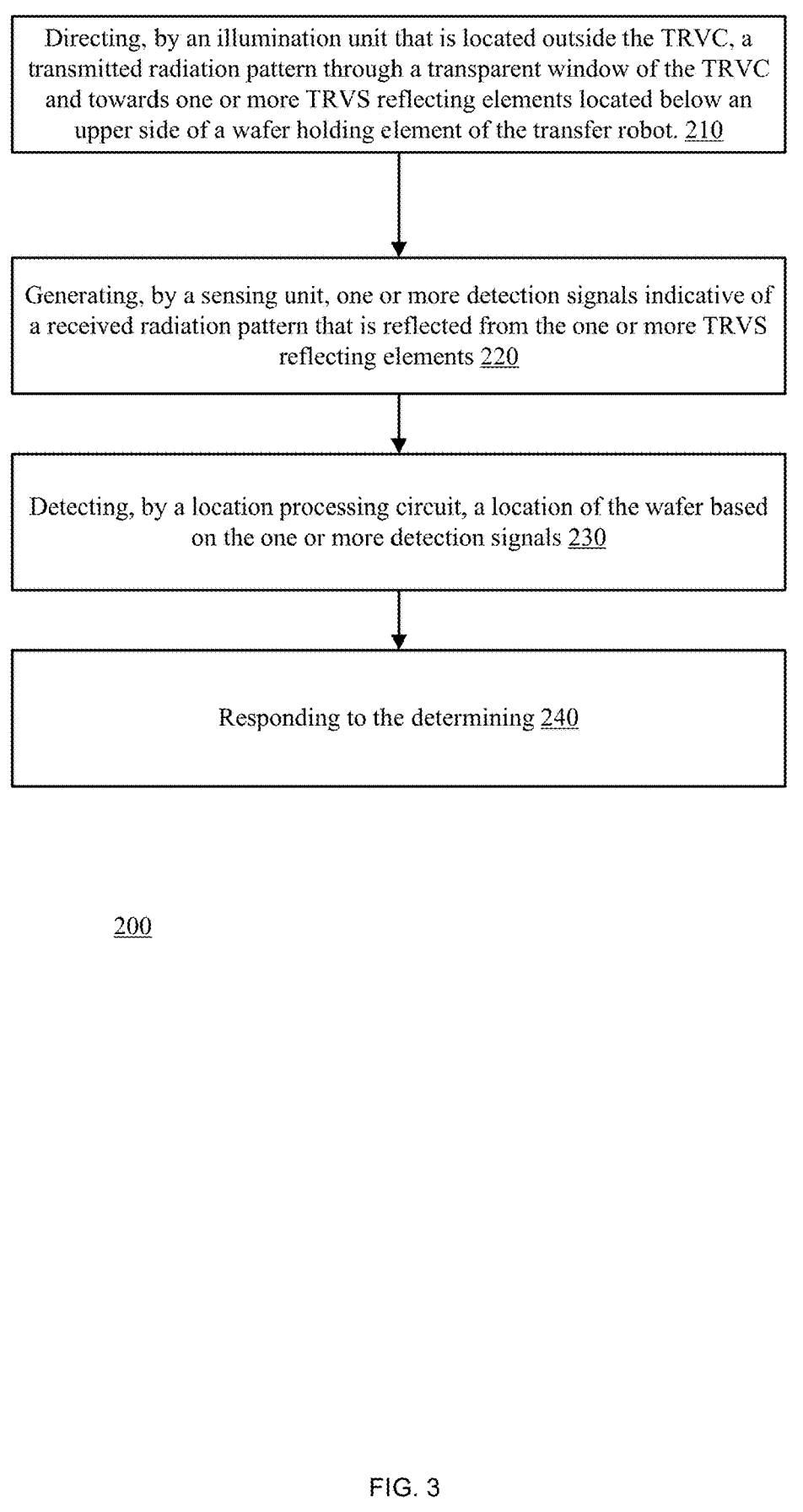

Directing, by an illumination unit that is located outside the TRVC, a transmitted radiation pattern through a transparent window of the TRVC and towards one or more TRVS reflecting elements located below an upper side of a wafer holding element of the transfer robot. 210

Generating, by a sensing unit, one or more detection signals indicative of a received radiation pattern that is reflected from the one or more TRVS reflecting elements 220

Detecting, by a location processing circuit, a location of the wafer based on the one or more detection signals 230

Responding to the determining 240

DETECTION OF A POSITION OF A WAFER WITHIN A TRANSFER ROBOT VACUUM CHAMBER

BACKGROUND OF THE INVENTION

A multi-chamber wafer system may include multiple vacuum chambers and a transfer robot. The multiple vacuum chambers may be used for one or more purposes—for example—wafer inspection, wafer review, wafer processing, and the like.

The transfer robot conveys the wafer between the multiple vacuum chambers. The transfer robot needs to be aware of the location of the wafer in order to align the wafer during the transfer of the wafer from one vacuum chamber to another.

The transfer robot is located within a transfer robot vacuum chamber (TRVC).

There is a growing need to monitor the location of the wafer when the wafer is within the TRVC and is supported by the transfer robot.

SUMMARY

A method for locating a wafer within a TRVS, a location detector detection system and non-transitory computer readable medium.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3 is an example of a method.

Figure 1:
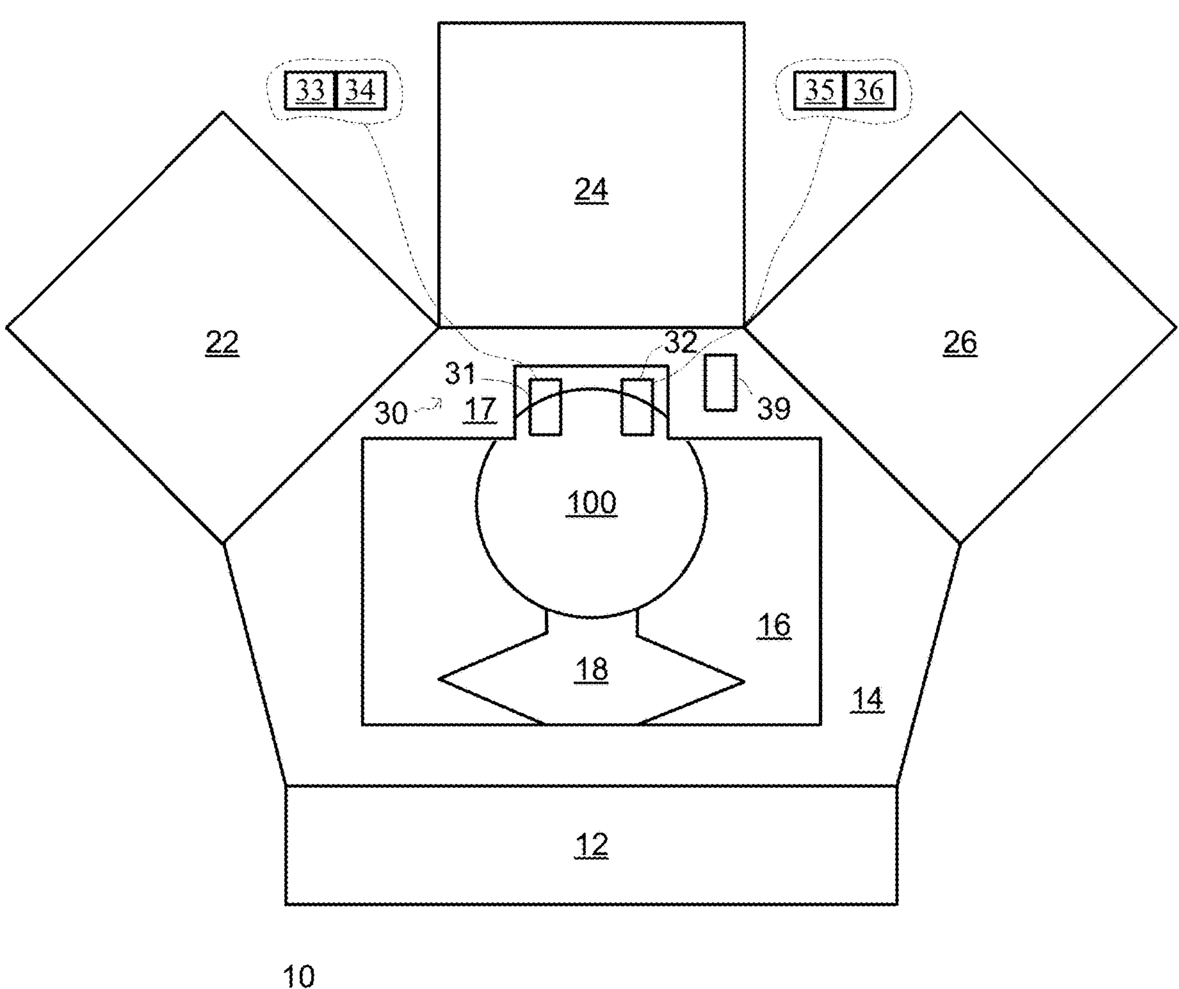
FIG. 1 is an example of a location detection system, a wafer, and a multi-chamber wafer system.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The term "and/or" means additionally or alternatively. For example—A and/or B—may mean only A, only B, or both A and B.

Any reference to a method should be applied mutatis mutandis to a system configured to execute the method.

Any reference to a system should be applied mutatis mutandis to a method executable by the system.

FIG. 1 illustrates an example of a location detection system 10, a wafer 100 and a multi-chamber wafer system 10 that includes multiple vacuum chambers (such as first vacuum chamber 22, second vacuum chamber 24 and third vacuum chamber), input/output unit 12, and a transfer robot 18 located within a TRVC 17. There may be two vacuum chambers or more than three vacuum chambers. The input/output unit is configured to receive wafers and to output wafers.

FIG. 1 illustrates the TRVC 17 as including a transparent window 16.

FIG. 1 also illustrates a location detection system 30 that includes one or more illumination units (for example—first illumination unit 33 and second illumination unit 35), one or more sensing units (for example—first sensing unit 34 and second sensing unit 36), and a location processing circuit 39.

The one or more illumination units may be located outside the TRVC.

The one or more sensing units may be located outside the TRVC.

The location outside the TRVC enable to easily add the location detection system to an existing TRVC, reduces contamination within the TRVC, reduces the cost of the location detection system, and may ease the maintenance of the location detection system.

The location detection system 30 may include a single sensing unit or may include more than two sensing units. The location detection system 30 may include a single illumination unit or may include more than two illumination units.

In FIG. 1 the first illumination unit 33 and the first sensing unit 34 form a first illumination and sensing unit 31. The second illumination unit 35 and the second sensing unit 36 form a second illumination and sensing unit 32.

Figure 2:
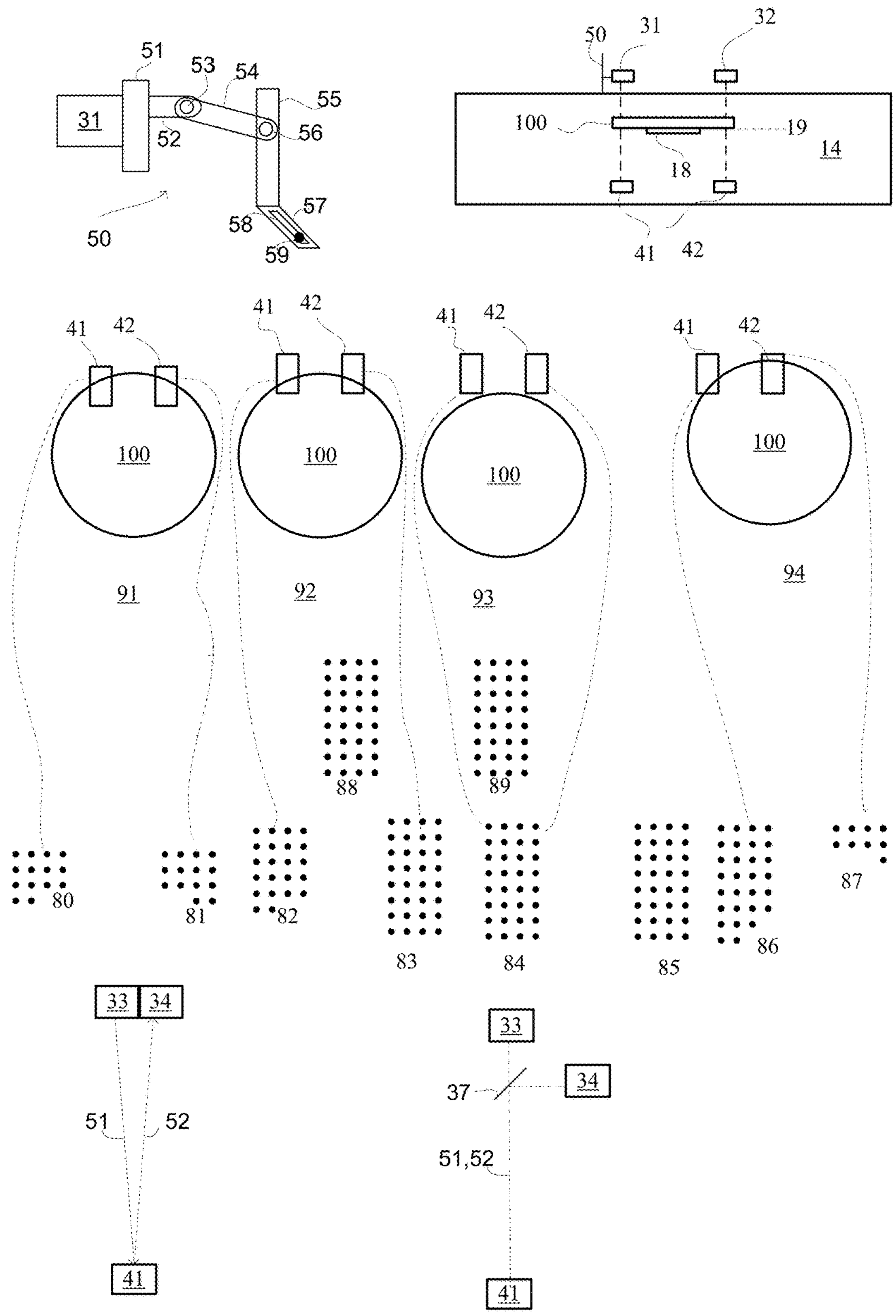
FIG. 2 illustrates examples related to location detection.

The first illumination unit 33 and the second illumination unit 35 are configured to direct radiation through transparent window 16 and towards one or more TRVS reflecting elements (for example TRVS reflecting elements 41 and 42 of FIG. 2).

The one or more TRVS reflecting elements are located below the wafer—so that the wafer (depending on its location) may block, partially block or not block the radiation. An example of the location of the one or more TRVS reflecting elements is illustrated in FIG. 2—below an upper side of a wafer holding element of the transfer robot 18—the upper side is located within virtual plane 19.

Referring to FIG. 2—the first illumination unit 33 is configured to direct a transmitted radiation pattern (denoted 51) through transparent window 16 towards one or more first TRVS reflecting elements 41 that are located below the upper side of the wafer holding element of the transfer robot. The second illumination unit 35 is configured to direct a transmitted radiation pattern through transparent window 16 towards one or more second TRVS reflecting elements 42 that are located below the upper side of the wafer holding element of the transfer robot.

There may be any relationship between the number of illumination units, the number of the sensing units and the number of TRVS reflecting elements.

FIG. 2 also illustrates four examples of locations of wafer 100 within the TRVS and how the location of an edge of the wafer impacts the reflected radiation pattern.

In all four examples it is assumed that a first transmitted radiation pattern (transmitted from first illumination unit 33) is a first rectangular array of transmitted beams 88, and that a second transmitted radiation pattern (transmitted from second illumination unit 35) is a second rectangular array of transmitted beams 88.

In the first, second and fourth examples (91, 92 and 93) that wafer partially blocks the transmitted radiation pattern—and the reflected radiation patterns (80, 81, 82, 83, 85 and 86) illustrate the partial blocking—which indicate the location of the edge of the wafer.

In the third example the wafer 100 is far enough from the transmitted radiation pattern and does not block any of the transmitted beams—and the reflected radiation pattern (see patterns 84 and 84) is the same (or almost the same) as the transmitted radiation pattern.

It should be noted that the previous example assumed that the transmitted beam pattern is an array of beams—and that each TRVS reflecting element is a continuous elements that is large enough to reflect all beams of the array of beams. A similar outcome may be obtained when TRVS reflecting elements are small and arranged in an array—to reflect spot shaped portions of a single radiation beam that is large enough to impinge on the arrays.

FIG. 2 also illustrates another example in which the first transmitted radiation pattern 51 (from first transmission unit 33) propagates at a non-normal angle towards first TRVS reflecting elements 41, and the reflected radiation pattern 52 is reflected at a non-normal angle towards the first sensing unit 34.

In a further example, the first transmitted radiation pattern 51 (from first transmission unit 33) propagates at a normal angle towards first TRVS reflecting elements 41, and the reflected radiation pattern 52 is reflected at the normal angle towards beam splitter 37 that directs it towards the first sensing unit 34.

FIG. 2 also illustrates a mechanical adaptor 50 that mechanically couples the first illumination and sensing unit 31 to a structural element (for example panel 17) of the TRVS. The mechanical adaptor 50 allows to adjust the location and angle of the first illumination and sensing unit 31—by using joints 53 and 56 and slide 58. The mechanical adaptor 50 also includes a first illumination and sensing unit adaptor 51, bars 52, 54 and 55, and apertured bar 57.

Any sensing unit is configured to generate one or more detection signals indicative of a received radiation pattern that is reflected from the one or more TRVS reflecting elements.

The location processing circuit 59 is configured to detect a location of the wafer based on the one or more detection signals. The determination may include determining the location of the edge of the wafer. The determination may be based on changes between the transmitted radiation pattern and the reflected radiation pattern, may be based on a difference between the reflected radiation pattern and a radiation pattern received when the wafer does not block at least part of the radiation, and the like. See, for example the relationship between the position of the wafer and the reflected radiation patterns of figure The wafer may be moved by the transfer robot. The location processing circuit may determined the location of the wafer when the wafer is static. It should be noted that the location may be determined during movement—but it may be less accurate or require fast enough detection that may virtually freeze the movement.

The one or more TRVS reflecting elements may include a first TRVS reflecting element that is configured to reflect radiation towards one or more first locations of the sensing unit, and a second TRVS reflecting element that is configured to reflect radiation towards one or more second locations of the sensing unit. The one or first locations and the one or more second locations differ from each other and may be one or more pixels of a sensing unit.

FIG. 3 illustrates method 200 for detecting a location of a wafer within a TRVC.

Method 200 may start by step 210 of directing, by an illumination unit that is located outside the TRVC, a transmitted radiation pattern through a transparent window of the TRVC and towards one or more TRVS reflecting elements located below an upper side of a wafer holding element of the transfer robot.

Step 210 may be followed by step 220 of generating, by a sensing unit, one or more detection signals indicative of a received radiation pattern that is reflected from the one or more TRVS reflecting elements.

Step 220 may include receiving the reflected light pattern.

Step 220 may include receiving, at one or more first locations of the sensing unit, reflected radiation from a first TRVS reflecting element; and receiving, at one or more second locations of the sensing unit, reflected radiation from a second TRVS reflecting element.

Step 220 may be followed by step 230 of detecting, by a location processing circuit, a location of the wafer based on the one or more detection signals.

Step 230 may include determining the location of the edge of the wafer. The determination may be based on changes between the transmitted radiation pattern and the reflected radiation pattern, may be based on a difference between the reflected radiation pattern and a radiation pattern received when the wafer does not block at least part of the radiation, and the like. See, for example the relationship between the position of the wafer and the reflected radiation patterns of FIG. 2.

The wafer may be moved by the transfer robot. The determining the location of the wafer may be executed when the wafer is static. It should be noted that the determining may be executed during movement—but it may be less accurate or require fast enough detection that may virtually freeze the movement.

Step 230 may be followed by step 240 of responding to the determining.

The responding may include aligning the wafer, instructing the transfer robot to move the wafer or correct a location of the wafer, initiate a transfer process of the wafer, continue a transfer process, stop a transfer process, generate a misalignment alter, and the like.

Any reference to any of the terms "comprise", "comprises", "comprising" "including", "may include" and "includes" may be applied, mutatis mutandis, to any of the terms "consists", "consisting", "consisting essentially of".

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A location detection system for detecting a location of a wafer within a transfer robot vacuum chamber (TRVC), the location detection system comprises:

an illumination unit that is configured to direct a transmitted radiation pattern, at an angle of incidence, through a transparent window of the TRVC and towards one or more TRVC reflecting elements located below an upper side of a wafer holding element of a transfer robot located within the TRVC; wherein the illumination unit is located outside the TRVC;

a sensing unit that is configured to generate one or more detection signals indicative of a received radiation pattern that is reflected from the one or more TRVC reflecting elements and is received at an angle of reflection that equals the angle of incidence; wherein the received radiation pattern is a two dimensional array of spaced apart spots when there is no wafer within the TRVC, (b) is a portion of the two dimensional array of spaced apart spots when the wafer partially blocks the transmitted radiation pattern, and (c) is null when the wafer completely blocks the transmitted radiation pattern;

and a location processing circuit that is configured to detect the location of the wafer based on the one or more detection signals.

2. The location detection system according to claim 1 wherein the transmitted radiation pattern comprises a two dimensional array of spaced apart radiation spots.

3. The location detection system according to claim 1 wherein the transmitted radiation pattern comprises a radiation beam, and wherein the one or more TRVC reflecting elements comprise a two dimensional array of spaced apart TRVC reflecting elements.

4. The location detection system according to claim 1 wherein the location processing circuit is configured to detect the location of the wafer while the wafer is static.

5. The location detection system according to claim 1 wherein the transmitted radiation pattern propagates along a path that is normal to the transparent window.

6. The location detection system according to claim 1 wherein the one or more TRVC reflecting elements comprises multiple TRVC reflecting elements that are spaced apart from each other.

7. The location detection system according to claim 6 wherein the location processing circuit is configured to compare detection signals indicative of reflection from at least two TRVC reflecting elements of the multiple TRVC reflecting elements.

8. The location detection system according to claim 1 wherein the location processing circuit is configured to detect a location of an edge of the wafer.

9. The location detection system according to claim 1 wherein the one or more TRVC reflecting elements comprises (i) a first TRVC reflecting element that is configured to reflect radiation towards one or more first locations of the sensing unit, and (ii) a second TRVC reflecting element that is configured to reflect radiation towards one or more second locations of the sensing unit.

10. The location detection system according to claim 1 wherein the location detection system comprises a mechanical adaptor for mechanically coupling at the sensing unit and the illuminating unit to the transparent window.

11. A method for detecting a location of a wafer within a transfer robot vacuum chamber (TRVC), the method comprising:

directing, by an illumination unit that is located outside the TRVC, and at an angle of incidence, a transmitted radiation pattern through a transparent window of the TRVC and towards one or more TRVC reflecting elements located below an upper side of a wafer holding element of a transfer robot located within the TRVC;

generating, by a sensing unit, one or more detection signals indicative of a received radiation pattern that is reflected from the one or more TRVC reflecting elements; the received radiation pattern is received at an angle of reflection that equals the angle of incidence; wherein the received radiation pattern is a two dimensional array of spaced apart spots when there is no wafer within the TRVC, (b) is a portion of the two dimensional array of spaced apart spots when the wafer partially blocks the transmitted radiation pattern, and (c) is null when the wafer completely blocks the transmitted radiation pattern;

and detecting, by a location processing circuit, the location of the wafer based on the one or more detection signals.

12. The method according to claim 11 wherein the transmitted radiation pattern comprises a two dimensional array of spaced apart radiation spots.

13. The method according to claim 11 wherein the transmitted radiation pattern comprises a radiation beam, and wherein the one or more TRVC reflecting elements comprise a two dimensional array of spaced apart TRVC reflecting elements.

14. The method according to claim 11 comprising detecting a location of an edge of the wafer.

15. The method according to claim 11 wherein the transmitted radiation pattern propagates along a path that is normal to the transparent window.

16. The method according to claim 11 wherein the one or more TRVC reflecting elements comprises multiple TRVC reflecting elements that are spaced apart from each other.

17. The method according to claim 16 comprising comparing detection signals indicative of reflection from at least two TRVC reflecting elements of the multiple TRVC reflecting elements.

18. The method according to claim 11 comprising detecting the location of the wafer while the wafer is static.

19. The method according to claim 11 comprising receiving, at one or more first locations of the sensing unit, reflected radiation from a first TRVC reflecting element;

and receiving, at one or more second locations of the sensing unit, reflected radiation from a second TRVC reflecting element.

20. A non-transitory computer readable medium that stores instructions for:

directing, by an illumination unit and at an angle of incidence, a transmitted radiation pattern through a transparent window of a transfer robot vacuum chamber (TRVC) and towards one or more TRVC reflecting elements located below an upper side of a wafer holding element of the transfer robot; wherein the illumination unit that is located outside the TRVC;

generating, by a sensing unit, one or more detection signals indicative of a received radiation pattern that is reflected from the one or more TRVC reflecting elements; the received radiation pattern is received at an angle of reflection that equals the angle of incidence; wherein the received radiation pattern is a two dimensional array of spaced apart spots when there is no wafer within the TRVC, (b) is a portion of the two dimensional array of spaced apart spots when the wafer partially blocks the transmitted radiation pattern, and (c) is null when the wafer completely blocks the transmitted radiation pattern;

and detecting, by a location processing circuit, a location of the wafer based on the one or more detection signals.

* * * * *